(12) United States Patent
Seidemann et al.

(10) Patent No.: US 10,446,541 B2
(45) Date of Patent: Oct. 15, 2019

(54) ADVANCED NODE COST REDUCTION BY ESD INTERPOSER

(71) Applicant: Intel IP Corporation, Santa Clara, CA (US)

(72) Inventors: Georg Seidemann, Landshut (DE); Christian Geissler, Teugn (DE); Klaus Reingruber, Langquaid (DE)

(73) Assignee: Intel IP Corporation, Santa Clara, CA (US)

( * ) Notice: Subject to any disclaimer, the term of this patent is extended or adjusted under 35 U.S.C. 154(b) by 0 days.

(21) Appl. No.: 15/743,996

(22) PCT Filed: Sep. 14, 2015

(86) PCT No.: PCT/US2015/049923
§ 371 (c)(1),
(2) Date: Jan. 11, 2018

(87) PCT Pub. No.: WO2017/048219
PCT Pub. Date: Mar. 23, 2017

(65) Prior Publication Data
US 2018/0204831 A1    Jul. 19, 2018

(51) Int. Cl.
*H01L 23/48*    (2006.01)
*H01L 27/02*    (2006.01)
(Continued)

(52) U.S. Cl.
CPC ........ *H01L 27/0296* (2013.01); *H01L 23/481* (2013.01); *H01L 23/60* (2013.01);
(Continued)

(58) Field of Classification Search
None
See application file for complete search history.

(56) References Cited

U.S. PATENT DOCUMENTS

2009/0283898 A1* 11/2009 Janzen .............. H01L 21/76898
                                                             257/698
2010/0237386 A1    9/2010 Lin et al.
(Continued)

OTHER PUBLICATIONS

International Preliminary Report on Patentability for PCT/US2015/049923, dated Mar. 29, 2018, 12 pages.
(Continued)

*Primary Examiner* — Hung K Vu
(74) *Attorney, Agent, or Firm* — Schwabe, Williamson & Wyatt, P.C.

(57) ABSTRACT

An apparatus including an electrostatic discharge circuit including a first circuit portion coupled beneath a die contact pad of an integrated circuit die and a second circuit portion in an interposer separate from the integrated circuit die, the interposer including a first contact point coupled to the contact pad of the integrated circuit die and a second contact point operable for connection to an external source. A method including forming an integrated circuit die including a first electrostatic discharge structure beneath a contact pad of the die; and coupling the die to an interposer including an interposer contact and a second electrostatic discharge structure, wherein a signal at the contact pad of the die is operable to be routed through the interposer.

23 Claims, 11 Drawing Sheets

(51) Int. Cl.
  *H01L 23/60*    (2006.01)
  *H01L 23/00*    (2006.01)
  *H01L 25/065*   (2006.01)
  *H01L 25/18*    (2006.01)
  *H01L 49/02*    (2006.01)
  *H01L 25/10*    (2006.01)
  *H01L 23/14*    (2006.01)
  *H01L 23/498*   (2006.01)

(52) U.S. Cl.
  CPC .............. *H01L 24/05* (2013.01); *H01L 24/16* (2013.01); *H01L 24/17* (2013.01); *H01L 24/48* (2013.01); *H01L 24/81* (2013.01); *H01L 25/0655* (2013.01); *H01L 25/18* (2013.01); *H01L 27/0255* (2013.01); *H01L 28/00* (2013.01); *H01L 23/147* (2013.01); *H01L 23/49816* (2013.01); *H01L 23/49827* (2013.01); *H01L 24/13* (2013.01); *H01L 24/32* (2013.01); *H01L 24/73* (2013.01); *H01L 25/105* (2013.01); *H01L 2224/02166* (2013.01); *H01L 2224/02372* (2013.01); *H01L 2224/0401* (2013.01); *H01L 2224/04042* (2013.01); *H01L 2224/0557* (2013.01); *H01L 2224/05548* (2013.01); *H01L 2224/12105* (2013.01); *H01L 2224/131* (2013.01); *H01L 2224/13007* (2013.01); *H01L 2224/13024* (2013.01); *H01L 2224/16145* (2013.01); *H01L 2224/16146* (2013.01); *H01L 2224/16235* (2013.01); *H01L 2224/16237* (2013.01); *H01L 2224/16238* (2013.01); *H01L 2224/17181* (2013.01); *H01L 2224/24137* (2013.01); *H01L 2224/32245* (2013.01); *H01L 2224/48091* (2013.01); *H01L 2224/48106* (2013.01); *H01L 2224/48108* (2013.01); *H01L 2224/48137* (2013.01); *H01L 2224/48145* (2013.01); *H01L 2224/48157* (2013.01); *H01L 2224/73253* (2013.01); *H01L 2224/73265* (2013.01); *H01L 2224/81815* (2013.01); *H01L 2225/1023* (2013.01); *H01L 2225/1041* (2013.01); *H01L 2225/1058* (2013.01); *H01L 2924/00014* (2013.01); *H01L 2924/10253* (2013.01); *H01L 2924/10271* (2013.01); *H01L 2924/14* (2013.01); *H01L 2924/15192* (2013.01); *H01L 2924/15311* (2013.01); *H01L 2924/15321* (2013.01); *H01L 2924/15331* (2013.01); *H01L 2924/19107* (2013.01)

(56) References Cited

U.S. PATENT DOCUMENTS

| | | |
|---|---|---|
| 2011/0304010 A1 | 12/2011 | Jiang et al. |
| 2012/0182650 A1 | 7/2012 | Chi |
| 2013/0063843 A1* | 3/2013 | Chen .................. H01L 23/552 361/56 |
| 2013/0249101 A1* | 9/2013 | Lin ...................... H01L 24/19 257/773 |
| 2015/0049406 A1* | 2/2015 | Besse .................. H02H 9/02 361/57 |

OTHER PUBLICATIONS

International Search Report and Written Opinion for International Patent Application No. PCT/US2015/049923 dated May 30, 2016, 16 pgs.

* cited by examiner

US 10,446,541 B2

ADVANCED NODE COST REDUCTION BY ESD INTERPOSER

CROSS-REFERENCE TO RELATED APPLICATION

This patent application is a U.S. National Phase Application under 35 U.S.C. § 371 of International Application No. PCT/US2015/049923, filed Sep. 14, 2015, entitled "ADVANCED NODE COST REDUCTION BY ESD INTERPOSER," which designates the United States of America, the entire disclosure of which is hereby incorporated by reference in its entirety and for all purposes.

BACKGROUND

Field

Integrated circuit structures particularly integrated circuit structures incorporating and implementing electrostatic discharge protection.

Description of Related Art

Electrostatic discharge (ESD) protection structures are included in an integrated circuit device to inhibit ESD damage during circuit production and handling as well as subsequent operation in the field. ESD structures are generally relatively area consuming and their size generally cannot be reduced in the manner that typical digital circuits have been reduced. Accordingly, ESD structures tend to increase die or chip area which can be relatively expensive for advanced silicon technology node.

DETAILED DESCRIPTION

Figure 1:
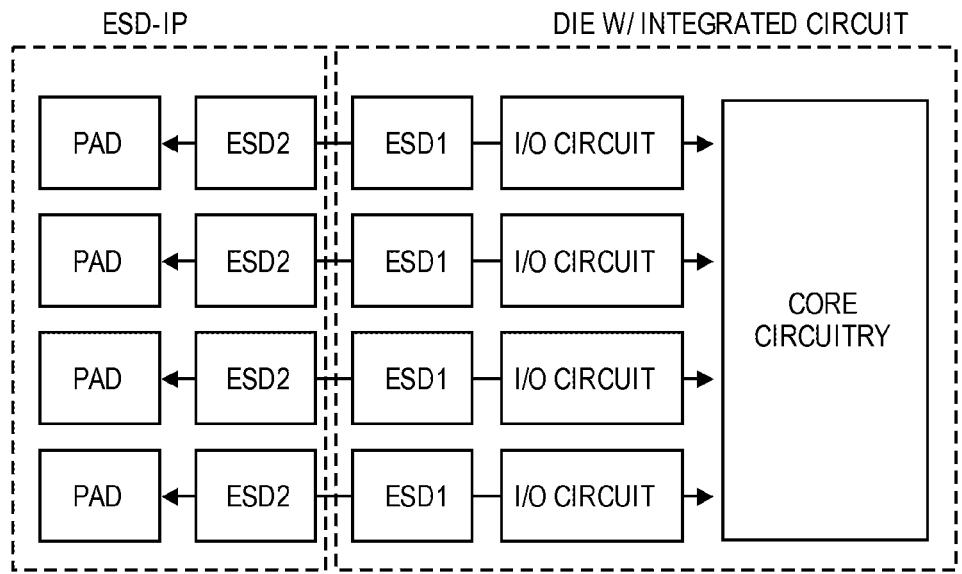
FIG. 1 shows a schematic block diagram of an embodiment of a layout of an assembly separating an ESD structure associated with an I/O contact pad into a first ESD structure associated with an advanced node die and a second ESD structure in a separate interposer.

An integrated device assembly is disclosed as methods for its manufacture, assembly and use. In one embodiment, the assembly includes an ESD circuit comprising a first circuit portion connected beneath a die contact pad of an integrated circuit die coupled to a second circuit portion in an interposer separate from the integrated circuit die. The assembly allows the separation of an ESD circuit into two portions of different ESD protection robustness, ESD protection robustness is defined by an ESD failure threshold voltage and by a maximum discharge current. An ESD failure threshold voltage or trigger voltage serves to clamp a potential ESD voltage pulse to a safe level to avoid dielectric rupture. The ESD failure threshold voltage designates a voltage at which an ESD discharge begins. Representatively, for an integrated circuit with a supply voltage of 5 volts (V), an example of an ESD failure threshold voltage will be somewhat greater (e.g., 6V or greater). An ESD maximum or peak discharge current is a current flow capability established to dissipate a large ESD current transient safely using a low-impedance discharging channel to prevent thermal damage in silicon and/or metal interconnects. The ESD failure threshold voltage is defined by the ESD diode formation (e.g., doping). For an ESD protection structure that includes a diode, the ESD maximum discharge current is defined primarily by diode area.

In one embodiment, a first circuit portion (e.g., one ESD structure) of an ESD circuit is in an integrated circuit die with the integrated circuit die also having, for example, a relatively high density of transistors and other active and passive devices operable to perform a variety of electrical functions. A second circuit portion (a second ESD structure) is in or otherwise associated with a separate structure such as a separate silicon die realized in a less expensive technology node. Representatively, the ESD structure associated with the integrated circuit die has an ESD protection robustness to protect the circuitry against ESD damage during production and testing in an ESD controlled environment while the second ESD structure provides additional ESD protection robustness to protect the integrated circuit from ESD events in the field. In one embodiment, the ESD protection robustness provided by the second ESD circuit portion or second ESD structure includes a greater maximum or peak discharge current than a maximum discharge current of the first ESD circuit portion or first ESD structure (ESDI2 (Interposer)>ESDI1 (IC)) and a smaller ESD failure threshold voltage than an ESD failure threshold voltage of the first ESD circuit portion or first ESD structure (ESDV2<ESDV1). Since an ESD maximum discharge current is mainly defined by diode area, the second ESD circuit portion, in one embodiment, occupies a larger amount of area than an area of the first ESD circuit portion. In this manner, for a desired level of ESD protection for I/O contact points of an integrated circuit die, a first ESD structure of the integrated circuit die that is, for example, an advanced node semiconductor structure with high device density, in one embodiment, consumes only enough semiconductor area for the level of ESD protection robustness required of the die (e.g., enough ESD protection robustness to protect the die during production and testing), and additional ESD protection robustness to protect the die in the field is incorporated in the interposer. An ESD structure in the interposer that has an ESD failure threshold voltage (or trigger voltage) that is less than an ESD failure threshold voltage of an ESD threshold voltage of an integrated circuit die to which it is connected serves to protect the integrated circuit die by avoiding high discharge current flow in the ESD structure of the integrated circuit die.

The ESD structure, in one embodiment, is associated with an interposer between an external input/output (I/O) contact (e.g., ball, bump, lead frame, contact) of the assembly and the advanced node circuit structure during packaging of the assembly. In one embodiment, the separation of ESD protection into two devices (e.g., an integrated circuit die and an interposer) allows a realization of a smaller ESD structure at the generally more expensive integrated circuit die. The integrated circuit die can thus be made smaller at a reduced cost due to smaller area consumed by ESD structures allowing an opportunity for more units per wafer and providing an increase in front end yield due to defect density yield.

Representatively, current techniques for providing ESD protection utilize an ESD structure to protect the I/O pads of an advanced node die with 500 pads has an area on the order of 3 mm². Assuming 500 pads are needed with ESD structures for contacts:

ESD—6000 µm²
Separation of ESD in ESD2 (large area interposer): ESD1 (small area IC die)=29:1;
Single area of ESD2 structure (@ 0.25 µm node)=5800 µm²;
Single area of ESD1 structure (@ 27 nm node)=200 µm² (e.g., 10×20 µm).
500 pads within chip:
Complete area of ESD=500×6000 µm²=3 mm²;
Complete area of ESD2=500×5800 µm²=2.9 mm²
Complete area of ESD1=500×200 µm²=0.1 mm²
Area (ESD1)/Area (ESD)~3%

The above example illustrates an area reduction of 97 percent relative to a conventional ESD protection formerly done in the expensive technology node by transitioning a portion of the ESD protection for I/O contact pads of an integrated circuit die to a less expensive technology node.

Generally speaking, each of the I/O contact point (e.g., contact pads) of an integrated circuit die or chip will include ESD protection. In one embodiment, described herein, an ESD protection circuit for an I/O contact is separated into a first circuit portion or a first ESD structure in the integrated circuit die and a second circuit portion or second ESD structure realized in a separate structure such as a less expensive technology node in the form of a separate interposer. Representatively, in terms of ESD protection robustness, the ESD circuit or ESD structure associated with the integrated circuit die has a smaller maximum discharge current than the ESD circuit or ESD structure associated with the interposer and the ESD structure associated with the interposer has a smaller ESD failure threshold voltage or trigger voltage than the ESD structure of the integrated circuit die. In one embodiment, the ESD circuit or ESD structure associated with the integrated circuit die has sufficient ESD robustness that is operable to protect the die (e.g., protect the I/O contact associated with the ESD structure) during processing in an ESD protected environment but inadequate to protect the die in the field. During packaging, the ESD circuit or ESD structure associated with the interposer may be connected to the integrated circuit die to realize the final product ESD protection robustness.

Assemblies of different types are possible that minimize the ESD protection provided by an integrated circuit die (e.g., ESD protection under I/O contacts of the die) with the incorporation of an interposer providing ESD protection between an integrated circuit die (e.g., an advanced node die) and an external contact. Examples of these types of assemblies include side-by-side; die stacking; one or more interposer connected to one integrated circuit die (e.g., advanced node die); and one or more integrated circuit die (e.g., advanced node die) sharing one or more interposers. The assemblies are applicable to different package types including flip-chip; WL-CSP; fan-out WLB; embedding; QFP; and QFN. The following paragraphs describe representative examples. In one embodiment of each example, the ESD structure provided at the integrated circuit die is minimized to provide ESD protection during die manufacturing and processing and the ESD structure provided at the interposer provides additional ESD protection for the I/O contacts of the die.

Figure 2:
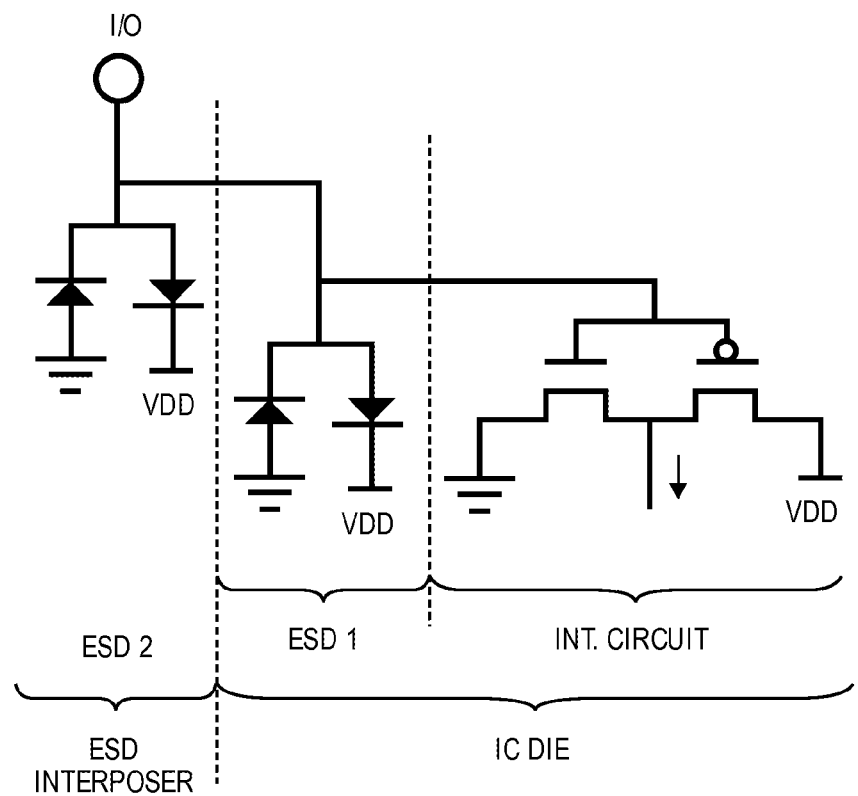
FIG. 2 shows a representation of a circuit diagram for an assembly including a first ESD structure associated with an advanced node die (e.g., ESD structures under respective individual I/O contact pad) and a second ESD structure in a separate interposer.

FIG. 1 shows a schematic block diagram of an embodiment of the layout of an assembly separating an ESD structures operable to protect respective I/O contact pads of an integrated circuit die into a first ESD structure associated with the integrated circuit die and a second ESD structure in a separate interposer. FIG. 2 shows a representation of a circuit layout for an ESD structure operable to protect a single I/O contact pad. The circuit layout shows a first ESD structure (ESD1) associated with the integrated circuit die (e.g., an ESD structure under an individual I/O contact pad) and a second ESD structure (ESD2) in a separate interposer.

Figure 3:
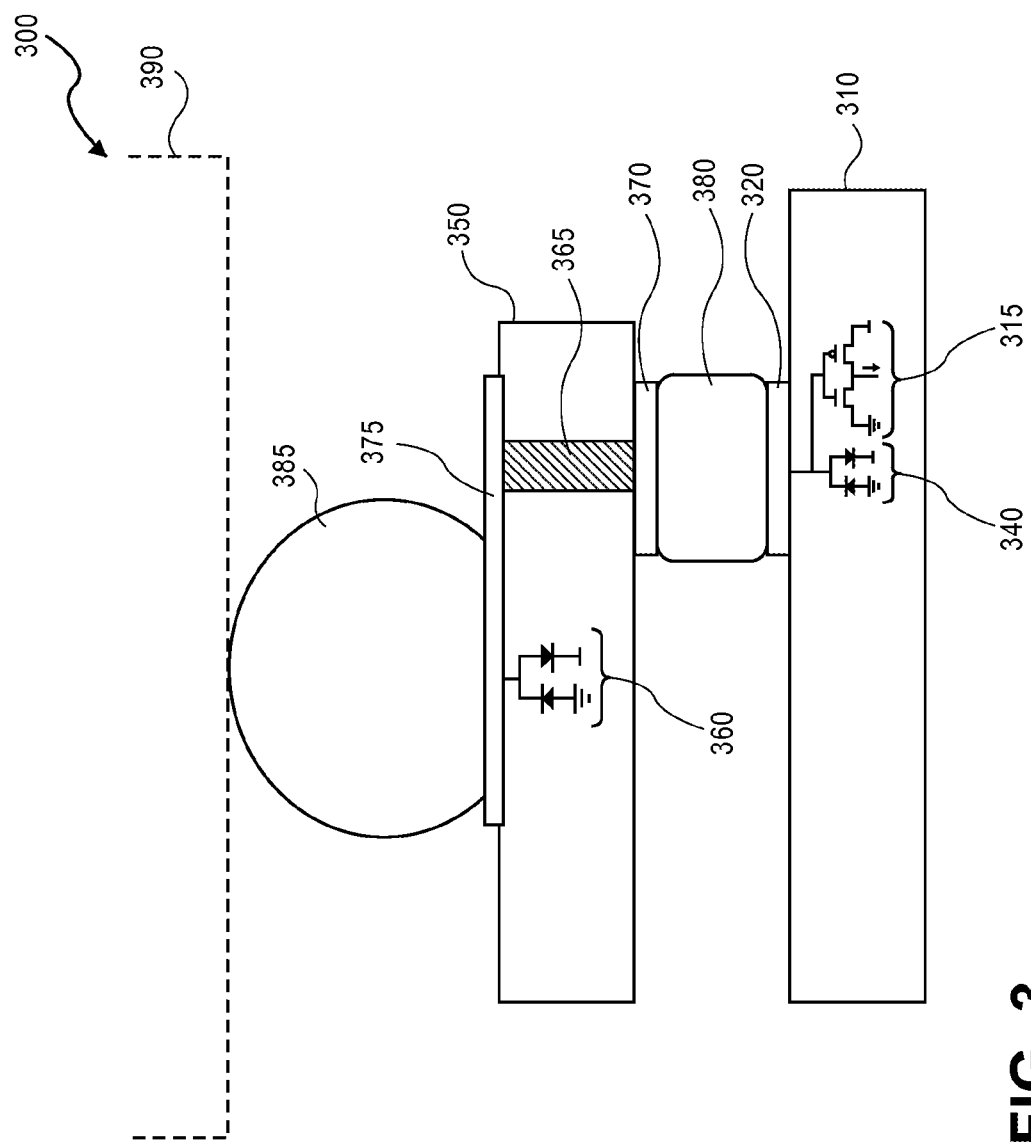
FIG. 3 shows a cross-sectional schematic view of an embodiment of an assembly including a portion of an integrated circuit die with a first ESD structure connected to an I/O contact pad connected to an interposer including a second ESD structure in a stacked or vertical orientation.

FIG. 3 shows a cross-sectional view of an embodiment of an assembly including a portion of an integrated circuit die illustrating a single I/O contact pad and a first ESD structure connected to an interposer with a second ESD structure in a stacked or vertical orientation. Assembly 300 includes integrated circuit die 310 that has, for example, a relatively high density of transistors and other active and passive devices operable to perform a variety of electrical functions. Die 310 includes an active side surface having such devices disposed thereon and therein and a backside surface. The active surface is formed by a variety of semiconductor process techniques including deposition, patterning, doping and heat treatment. In the deposition process, materials are grown or deposited on a semiconductor substrate (e.g., silicon, silicon germanium) by techniques involving oxidation, nitridation, chemical vapor deposition, evaporation and sputtering. Photolithography techniques may be used to mask portions of the surface and etch away undesired material to form specific structures while doping processes inject concentrations of dopant material by, for example, thermal diffusion or ion implantation. Ones of the devices (e.g., active and passive devices) are connected (integrated) according to an electrical design of the die and generally involve routing through conductive metallization layers (e.g., multiple metallization layers). Die 310 includes a number of I/O contact pads 320 (one shown) that may be connected to one or more layers of the metallization and are used to bring signals (e.g., logic, power, ground) to die 310 or send signals out from die 310.

In one embodiment, associated with each pad 320 (e.g., each I/O) of die 310, there is an ESD protection structure integrated beneath the contact pad. FIG. 3 shows ESD structure 340 formed, for example, in bulk semiconductor material beneath contact pad 320. ESD structure 340 representatively serves to protect circuitry associated with die 310. FIG. 3 shows ESD structure 340 connected in parallel to circuit 315. ESD structure 340 protects circuit 315 by, for example, responding in the event of a circuit charge of the ESD structure and directing any high voltage to ground (e.g., a common ground) instead of to circuit 315.

Disposed over die 310 in a stacked or vertical orientation, in the embodiment shown in FIG. 3, is interposer 350. In one embodiment, interposer 350 may be formed from a semiconductor wafer structure in a less expensive technology node or a node that is not as dense in terms of devices as die 310. In this embodiment, interposer 350 includes contact pads 375 (one shown) on one surface of interposer 350, backside contact pads 370 (one shown) on an opposite surface of interposer 350 and a conductive path between ones of respective contact pads 375 and backside contact pads 370. FIG. 3 shows interposer 350 having ESD structure 360 (e.g., one or more diodes) therein and connected to contact pad 375. As illustrated, backside contact pad 370 of, for example, copper (e.g., copper pad) is connected to ESD structure 360 through conductive through silicon via (TSV) or conductive implant 365. Similarly, ESD structure 360 is connected to contact pad 375. In this embodiment, contact pad 320 of die 310 is connected to backside contact pad 370 of interposer 350 through a conductive interconnect 380 such as a solder connection. FIG. 3 also shows solder ball 385 on contact pad 375 of interposer 350. Contact pad 375 serves as the I/O pad for the assembly including die 310 and interposer 350. Solder ball 385 may be used to connect assembly 300 to a substrate, such as package substrate 390.

Figure 4:
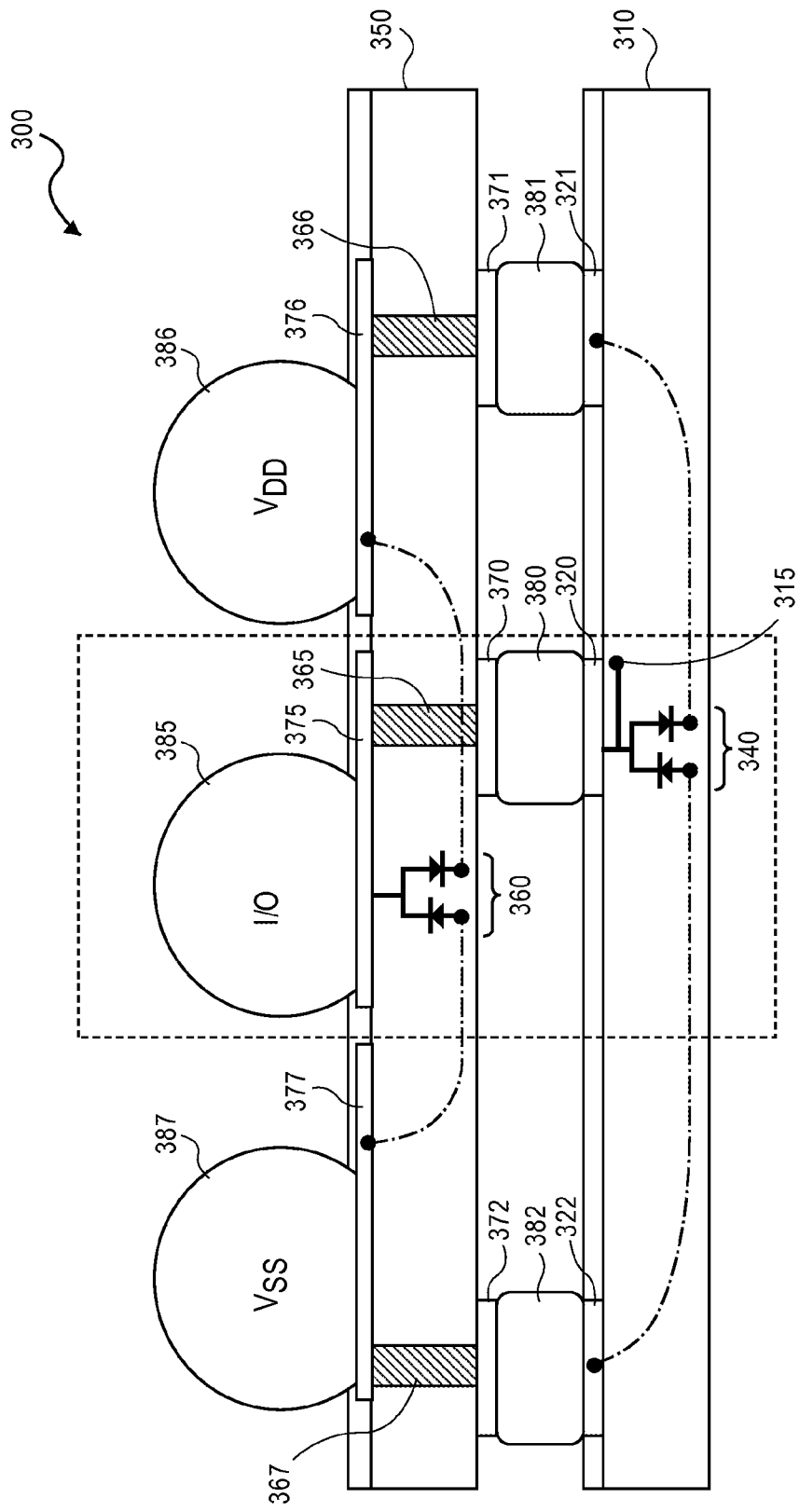
FIG. 4 shows an expanded cross-sectional schematic view of the assembly of FIG. 3 and shows the orientation for connection of the assembly to a supply voltage and a ground.

FIG. 4 shows a cross-sectional side view of an assembly including an interposer connected to an integrated circuit die in a stacked or vertical orientation. FIG. 4 is an expanded view of the assembly of FIG. 3 to show the connection of a supply voltage ($V_{DD}$) and a common ground ($V_{SS}$). Referring to FIG. 4, assembly 300 includes die 310 including a number of I/O contact pads (contact pad 320 shown) with ESD protection structure 340 beneath the corresponding pad. Die 310 also includes contact pad 321 for connection to a supply voltage and contact pad 322 for connection to a common ground.

Overlying die 310 in FIG. 4 is interposer 350. Interposer 350 includes a number of ESD structures each corresponding to I/O contact pads of die 310 (ESD structure 360 corresponding to contact pad 320). Interposer 350 includes I/O contact pad 375, contact pad 376 for connection to a positive supply voltage and contact pad 377 for connection to a negative supply voltage on a first side (device side) of interposer 350 and backside contact pad 370, backside contact pad 371 and backside contact pad 372 on an opposite side. FIG. 4 shows ESD structure 360 connected to I/O contact pad 375 and TSV or implant 365 connecting contact pad 375 and backside contact pad 370; contact pad 376 connected to backside contact pad 371 through TSV or implant 366; and contact pad 377 connected to backside contact pad 372 through TSV or implant 367. Backside contact pads 370, 371 and 372 of interposer 350 are connected to respective contact pads 380, 381 and 382 of die 310 through solder connections 380, 381 and 382 of die 310 through solder connections 380, 381 and 382, respectively. Assembly 300 also includes solder balls 385, 386 and 387 connected to contact pads 375, 376 and 377, respectively, for connection of the assembly to a substrate.

As illustrated in FIG. 4, ESD structure 340 of die 310 is connected to I/O contact pad 320 and to a positive supply voltage through connection to contact pad 321 and to a negative supply voltage through connection to contact pad 322. Similarly, ESD structure 360 of interposer 350 is connected to I/O contact pad 375 and to a positive supply voltage through connection to contact pad 376 and to a negative supply voltage through connection to contact pad 377.

Figure 6:
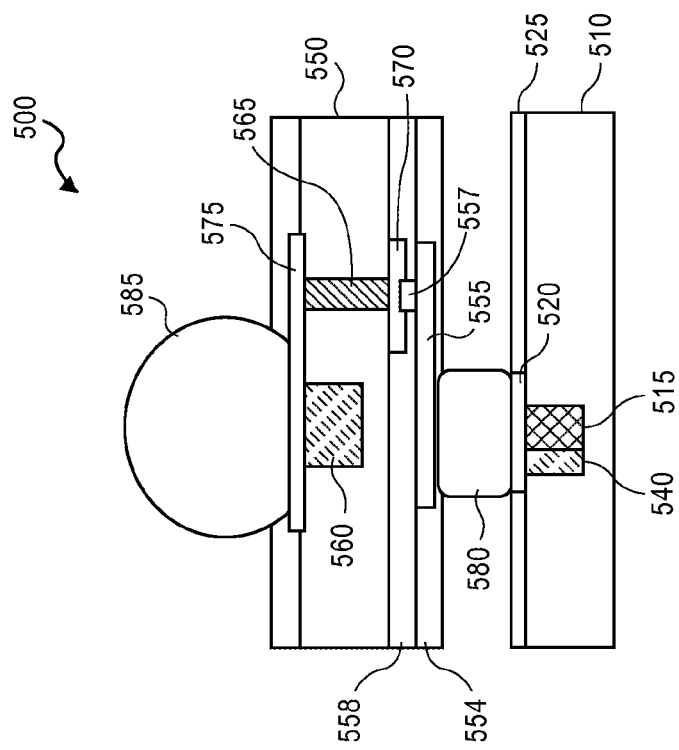
FIG. 6 shows a cross-sectional schematic side view of another embodiment of an assembly including an integrated circuit die and an interposer in a stacked or vertical orientation where the interposer includes a redistribution layer.
Figure 5:
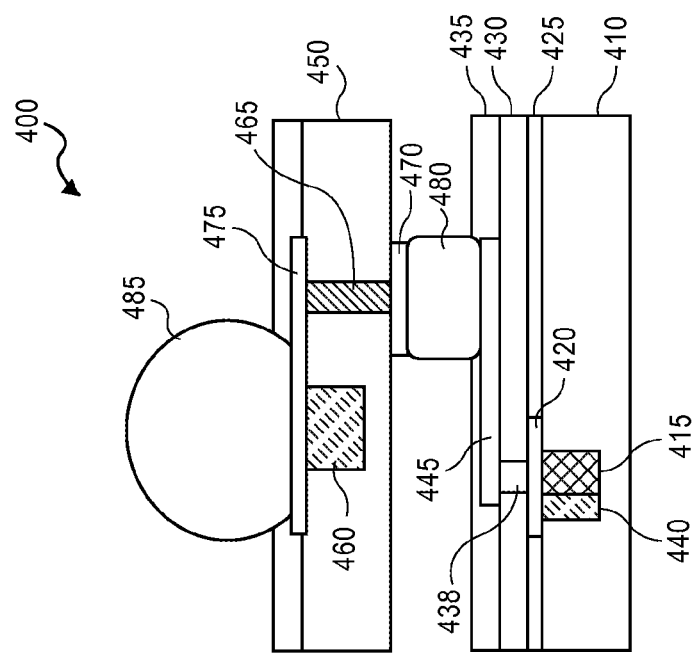
FIG. 5 shows a cross-sectional schematic side view of another embodiment of an assembly including an interposer connected to an integrated circuit die in a stacked or vertical orientation where the die includes a redistribution layer.

In the embodiment of an assembly shown in FIGS. 3 and 4, the I/O contact pads of the integrated circuit die and the interposer were generally aligned vertically as viewed (generally aligned in an xy dimensions where an x-dimension is defined across the page and a y-dimension is defined into or out of the page). In another embodiment, a redistribution layer may be used to route between the contact pads. A redistribution layer, line or trace could be utilized, for example, where the I/O contact pads of the die are positioned in a different x- and/or y-position than contact pads (and corresponding ESD structure) of an interposer or more than one I/O contact pads of a die are connected to a common contact pad of an interposer to share an ESD structure of the interposer. FIG. 5 and FIG. 6 illustrate examples of assemblies using a redistribution layer or trace to interconnect I/O contact pads of a die with contact pads of an interposer.

FIG. 5 shows a cross-sectional view of an embodiment of an assembly including a portion of an integrated circuit die illustrating a single I/O contact pad and a first ESD structure connected to an interposer with a second ESD structure in a stacked or vertical orientation. Assembly 400 includes integrated circuit die 410. Die 410 includes an active side surface having, for example, a relatively high density of transistors and other devices disposed thereon and therein and a backside surface. On a device side, die 410 have a number of I/O contact pads (I/O contact pad 420 shown).

In one embodiment, associated with I/O contact pad 420 of die 410, there is an ESD protection structure integrated beneath the contact pad. FIG. 5 shows ESD structure 440 formed, for example, in bulk semiconductor material connected to contact pad 420. ESD structure 440 representatively serves to protect circuitry associated with die 410. FIG. 5 shows ESD structure 440 connected in parallel to circuit 415.

In the embodiment illustrated in FIG. 5, I/O contact pad 420 is embedded in passivation layer 425 of, for example, silicon dioxide, a nitride or oxide nitride on a device side surface of die 410. Disposed on passivation layer 425 is dielectric layer 430 of, for example, a polyimide, a polybenzoxazole (PBO) or an FR2. Disposed on dielectric layer 430 is redistribution layer 440 of a conductive material such as copper. Redistribution layer 440 is connected to I/O contact pad 420 through redistribution layer via 438. Redistribution layer 440, in one embodiment, serves to route a signal between contact pad 420 and a contact pad of an interposer at a different x- and/or y-dimension. One way to form redistribution layer 440 and redistribution layer via 438 is by an electroplating process. First, an opening is made through dielectric layer 430 to contact pad 402. An electroless seed material is introduced in the opening and on a surface of dielectric layer 430 and then a mask to define an area for redistribution layer formation. A conductive material such as copper is then introduced on the exposed seed material by a plating process. Following plating, the mask and undesired seed material is removed. Dielectric material 435 such as a solder resist (e.g., polyimide, PBO, FR2) is then introduced on redistribution layer 440 and an area of redistribution layer is exposed for electrical connection. Representatively, an X- and/or Y-position of the exposed area of redistribution layer 440 is different than an X- and/or Y-position of contact pad 420 of die 410.

Disposed over die 410 in a stacked or vertical orientation, in the embodiment shown in FIG. 5, is interposer 450. In one embodiment, interposer 450 may be formed from a semiconductor wafer structure in a less expensive technology node or a node that is not as dense in terms of devices as die 410. In this embodiment, interposer 450 includes a number of contact pads 475 (one shown) on one surface of interposer 450, backside contact pads 470 (one shown) on an opposite surface of interposer 450 and a conductive path between ones of respective contact pads 475 and backside contact pads 470. FIG. 5 shows interposer 450 having ESD structure 460 (e.g., one or more diodes) therein and connected to contact pad 475. As illustrated, backside contact pad 470 of, for example, copper (e.g., copper pad) is connected to ESD structure 460 through conductive through silicon via (TSV) or conductive implant 465. Similarly, ESD structure 460 is connected to contact pad 475. In this embodiment, backside contact pad 470 of interposer 450 is connected to an exposed area of redistribution layer 445 through a conductive interconnect 480 such as a solder connection. FIG. 5 also shows solder ball 485 on contact pad 475 of interposer 450. Contact pad 475 serves as the I/O contact pad for the assembly including die 410 and interposer 450. Solder ball 485 may be used to connect assembly 400 to a substrate, such as package substrate.

FIG. 6 shows a cross-sectional view of an embodiment of an assembly including a portion of an integrated circuit die illustrating a single I/O contact pad and a first ESD structure connected to an interposer with a second ESD structure in a stacked or vertical orientation. Assembly 500 includes integrated circuit die 510 that has, for example, a relatively high density of transistors and other active and passive devices operable to perform a variety of electrical functions. Die 510 includes an active side surface having such devices disposed thereon and a backside surface. Die 510 includes a number of I/O contact pads (I/O contact pad 520 shown) that may be connected to one or more layers of metallization in the die and are used to bring signals to die 510 or send signals out from die 510.

In one embodiment, connected to I/O contact pad 520 of die 510 is circuit 515 and ESD structure 540 formed, for example, in bulk semiconductor material beneath contact pad 520. ESD structure 540 representatively serves to protect circuitry associated with die 510. FIG. 6 shows ESD structure 540 connected in parallel to circuit 515.

Disposed over die 510 in a stacked or vertical orientation, in the embodiment shown in FIG. 6, is interposer 550. In one embodiment, interposer 550 may be formed from a semiconductor wafer structure in a less expensive technology node or a node that is not as dense in terms of devices as die 510. In this embodiment, interposer 550 includes contact pads 575 (one shown) on one surface of interposer 550, backside contact pads 570 (one shown) on an opposite surface of interposer 550 and conductive path 565 (e.g., a TSV or conductive implant) between ones of respective contact pads 575 and backside contact pads 570. FIG. 6 shows interposer 550 having ESD structure 560 (e.g., one or more diodes) therein and connected to contact pad 575. Backside contact pad 570 is connected to ESD structure 560 through conductive path 565.

FIG. 6 shows backside contact pad 570 embedded in dielectric material layer 558 of a material such as silicon dioxide, a nitride or a polyimide. Disposed on dielectric layer 558 (under as viewed) is conductive redistribution layer or trace 555 connected to backside contact pad 570 through conductive via 557. Redistribution layer 555 and conductive via 557 may be formed as described above with respect to assembly 400 (FIG. 5). Overlying redistribution line 555 (underlying as viewed) of, for example, solder resist, with an area of redistribution layer 555 exposed through dielectric layer 554 (e.g., polyimide, PBO, FR2). The exposed area of redistribution layer 555, in one embodiment, has a different x- and/or y-position than an x- and/or y-position of contact pad 520 of die 510. FIG. 6 shows interconnect 580 connected to I/O contact 520 of die 510 and to redistribution layer 555. The incorporation of redistribution layer 555 on interposer 550 provides a connection between the interposer and I/O contact pad 520 of die 510 where I/O contact pad 520 is at a different x- and/or y-position than an x- and/or y-position of backside contact pad 570 of interposer 550.

Figure 7:
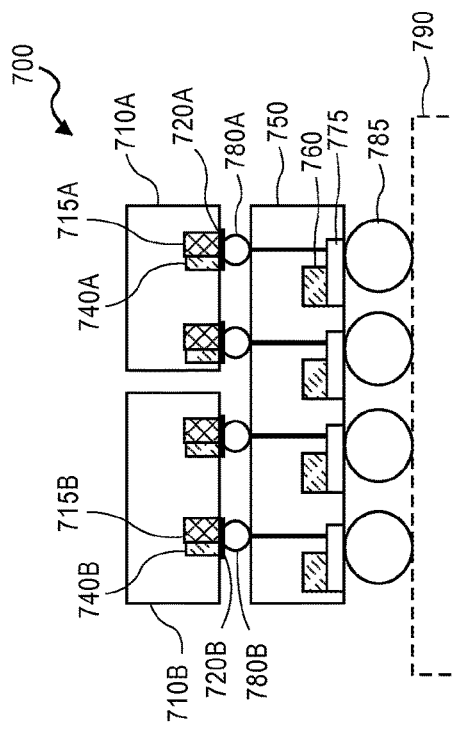
FIG. 7 shows a cross-sectional schematic side view of another embodiment of an assembly including an integrated circuit die connected to an interposer in a stacked or vertical orientation.

An assembly of one or more die and one or more interposers in a stack orientation can take various configurations depending on the ESD protection requirements of the die(s). FIGS. 7-10 show representative embodiments. FIG. 7 shows assembly 600 including a single die stack on an interposer in a vertical or stacked orientation. Die 610 includes a number of I/O contact pad 620 each connected to integrated circuit 615 through and having ESD structure 640 connected in parallel to circuit 615. In this embodiment, die is connected to interposer 650 through solder connection 680 between I/O contact pad 620 and contacts on a surface of interposer 650 (e.g., backside surface). An opposite side surface of interposer 650 includes contact pads 675. Each contact pad is electrically connected to respective ones of solder connection 680 through, for example, a TSV. Also connected to each contact pad is ESD structure 660. Contact pads 675 are representatively connected to a substrate (e.g., package substrate) through solder balls 685).

Figure 8:
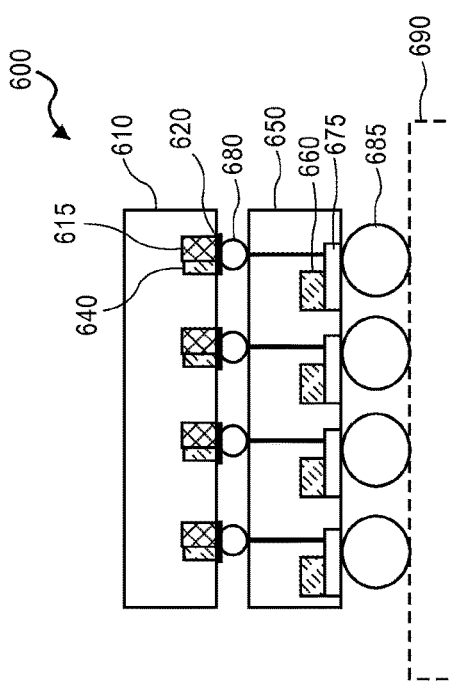
FIG. 8 shows a cross-sectional schematic side view of another embodiment of an assembly including two integrated circuit dies connected to an interposer in a stacked or vertical orientation.

FIG. 8 shows an embodiment of an assembly including two dies connected to a single interposer in a vertical orientation. Assembly 700 includes die 710A including contact pads 720A connected to ESD structure 740A and circuitry 715A and die 710B including I/O contact pad 720B connected to circuitry 715B and ESD structure 740B. Each die is connected to contacts on a surface of interposer 750

(e.g., a backside surface) through solder connections 780A and 780B, respectively. An opposite surface of interposer 750 includes contact pads 775 each connected to ESD structure 760 and to solder connections 780A and 780B, respectively, by way of, for example, TSVs. Assembly 700 is connected to substrate 790 through, for example, solder ball 785 connected to contact pads 775.

Figure 9:
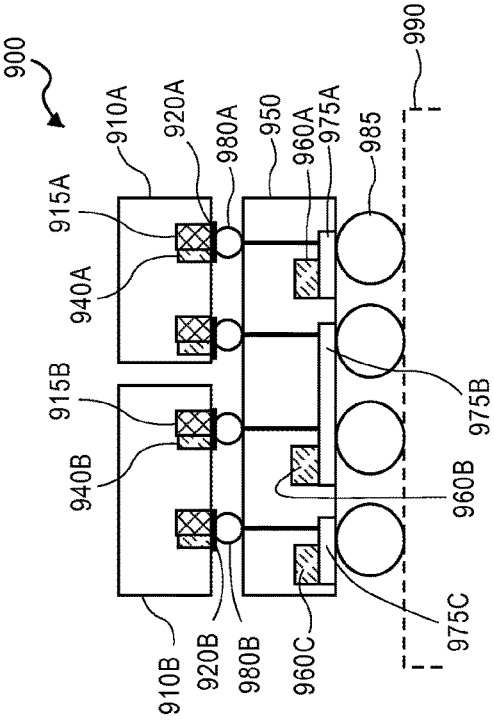
FIG. 9 shows a cross-sectional schematic side view of another embodiment of an assembly including two integrated circuit dies connected to an interposer where contact pads of the interposer has varied ESD protection robustness.

In each of assembly 600 (FIG. 7) and assembly 700 (FIG. 8), the ESD structures of the interposer provide a representatively similar ESD protection robustness. In another embodiment, the ESD structure may have different ESD protection robustness (e.g., some ESD structures having more ESD protection robustness than other ESD structures). FIG. 9 shows an embodiment of an assembly including two die connected to a single interposer in a vertical orientation where the interposer has ESD protection structures of different ESD protection robustness. Assembly 800 includes die 810A including contact pad 820A including circuitry 815A and ESD structure 840A and die 810B including I/O contact pad 820B connected to circuit 815B and ESD structure 840B. Die 810A is connected to interposer 850 through solder connection 880A between I/O contact pad 820A and a corresponding contact pad on a surface of interposer 850. Die 810B is connected to interposer 850 through solder connection 880B between I/O contact pad 820B and a corresponding contact pad on a surface of interposer 850. An opposite side of interposer 850 includes contact pads 875A, 875B, 875C and 875D electrically connected to respective ones of the contact pads on an opposite side of the interposer by way of, for example, TSVs. Each contact pad 875A-D is also connected to an ESD structure. In this embodiment, the ESD structures include ones that have different ESD protection robustness. As illustrated, ESD structure 860A has less ESD protection robustness than ESD structure 860B which itself has less ESD protection robustness than ESD structure 860C. Representatively, ESD structure 860D, in this embodiment, has a similar ESD protection robustness to that of ESD structure 860B.

Figure 10:
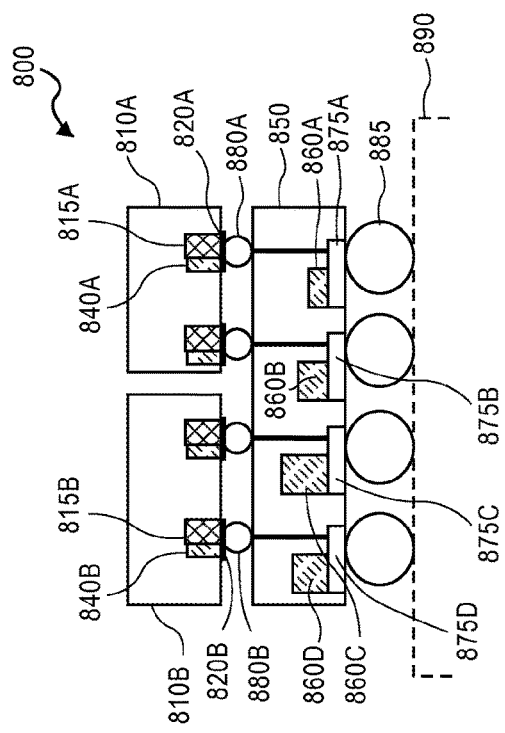
FIG. 10 shows a cross-sectional schematic side view of another embodiment of an assembly including two integrated circuit dies connected to an interposer wherein two I/O contact pads share an ESD protection structure of the interposer.

In the previous embodiments, the ESD protection afforded to I/O contact pad by the interposer corresponded to a one-to-one relationship between contact pads and interposer ESD structures. In another embodiment, I/O contact pads of a die may share one or more ESD protection structures of an interposer. FIG. 10 shows an embodiment of an assembly including multiple dies connected to a single interposer in a vertical orientation where the I/O contact pads of the dies share an ESD structure of the interposer. Assembly 900 includes die 910A including contact pad 920A connected to circuitry 915A and ESD structure 940A and die 910B connected to circuitry 915B and ESD structure 940B. I/O contact pads 920A of die 910A are connected to interposer 950 through solder connections 980A and contact pads 920B of die 910B are connected to interposer 950 through solder connections 980B. An opposite side of interposer 950 includes contact pads 975A, 975B and 975C. Contact pads 975A-C are electrically connected to contact pads on an opposite side surface of interposer 950. Connected to each contact pads 975A-C are ESD structure 960A, ESD structure 960B and ESD structure 960C, respectively. In this embodiment, ones of I/O contact pads 920A of die 910A are respectively connected to contact pad 975A and contact pad 975B of interposer 950. Ones of I/O contact pads 920B of die 910B are respectively connected to contact pad 975B and contact pad 975C of interposer 950. As described, an I/O contact of die 910A and an I/O contact of die 910B are each connected to contact pad 975B of interposer 950. In one embodiment, each of the respective contact pad of die 910A and die 910B share ESD structure 960B of interposer 950. ESD structure 960B may offer similar or increased ESD protection robustness as other ESD structures associated with interposer 950. Assembly 900 is connected to substrate 990 through solder balls 985 connected to contact pad 975A-975C.

Figure 11:
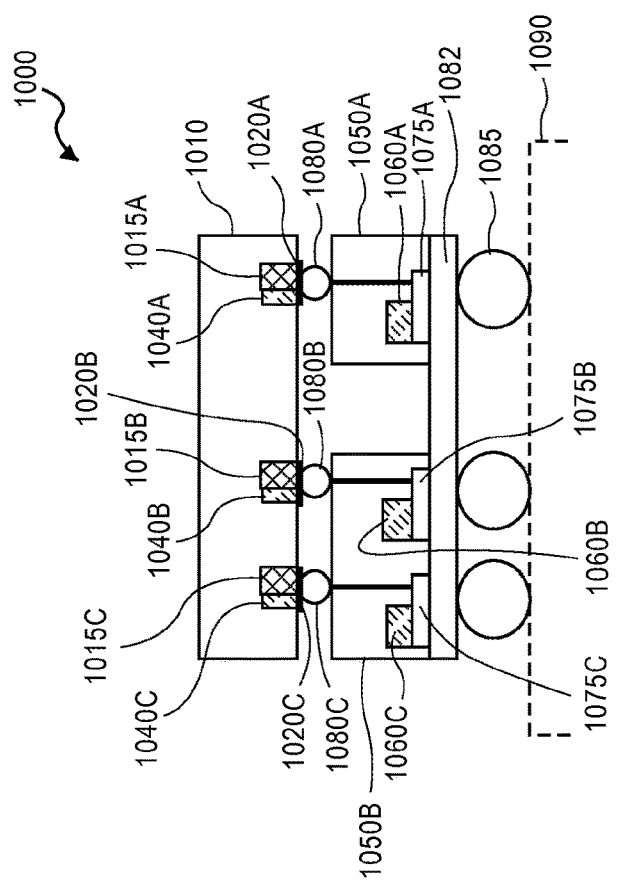
FIG. 11 shows a cross-sectional schematic side view of another embodiment of an assembly including an integrated circuit die connected to two interposers in a stacked or vertical orientation.

FIG. 11 shows an embodiment of an assembly including a single die connected to multiple interposers. Referring to FIG. 11, assembly 1000 includes die 1010 including contact pads 1020A connected to circuitry 1015A and ESD structure 1040A and contact pads 1020B connected to circuitry 1015B and ESD structure 1040B and contact pads 1020C connected to circuitry 1015C and ESD structure 1040C. In this embodiment, contact pad 1020A of die 1010 is electrically connected to a contact pad on a surface of interposer 1050A through solder connection 1080A. Similarly, contact pad 1020B and contact pad 1020C of die 1010 are connected to respective contact pads of separate interposer 1050B. Each of interposer 1050A and interposer 1050B is connected to substrate 1082 that is, for example, a flipchip substrate or wafer level RDL substrate. Interposer 1050A includes contact pads 1075A on an opposite side surface of the interposer and electrically connected to I/O contact pad 1020A of die 1010. Contact pad 1075 also includes ESD structure 1060A. Interposer 1050B includes contact pad 1075B and contact pad 1075C respectively connected to I/O contact pad 1020B and I/O contact pad 1020C of die 1010 with contact pad 1075B also connected to ESD structure 1060B and contact pad 1075C also connected to ESD structure 1060C. Each of interposer 1050A and interposer 1050B are electrically connected to substrate 1082 on one side surface of the substrate. Substrate 1082 includes an opposite side surface having contact pads for connection of the substrate to substrate 1090 (e.g., printed circuit board or package substrate). Substrate 1082 includes electrical routing through the substrate between contact points of contact pads 1075A-C and contact pads on an opposite side of substrate 1082. FIG. 11 shows solder balls 1085 connecting the assembly to substrate 1090 (e.g., a package substrate).

Figure 12:
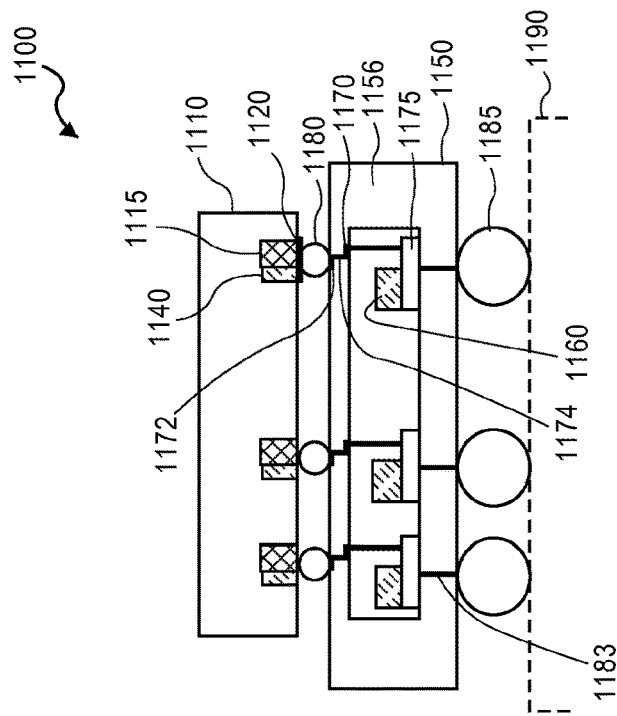
FIG. 12 shows a cross-sectional schematic side view of another embodiment of an assembly including an integrated circuit die connected to an interposer in a stacked or vertical orientation where the interposer is embedded in a substrate.

FIG. 12 shows an embodiment of an assembly including a die connected to an interposer in a vertical orientation where the interposer is embedded in a substrate. Assembly 1100 include die 1110 including a number of contact pads 1120 each connected to circuitry 1115 and having ESD structure 1140. Assembly 1100 also includes interposer 1150 embedded in substrate 1156. In one embodiment, interposer 1150 is embedded through a wafer embedding process with, for example, mold compound surrounding the interposer to define substrate 1156. Interposer 1150 includes I/O contact pads 1170 on one surface (e.g., a backside surface) and contact pads 1175 on an opposite side surface (a device side surface). The respective ones of contact pads 1175 are connected to ones of contact pads 1170 as well as to respective ESD structures 1160. In this embodiment, I/O contact pads 1120 are connected to contact pads 1172 on a surface of substrate 1156 through solder connections 1180. Such contact pads 1172 are connected to respective ones of contact pads 1170 of interposer 1150 through conductive vias 1174 in substrate 1156. An opposite side of substrate 1156 includes conductive vias 1183 connected between contact pads 1175 of interposer 1150 and contact points or pads on a surface of the substrate. Solder balls 1185 are connected to such contact pads on a surface of substrate 1156. Such solder balls 1185 may be used to connect assembly 1100 to substrate 1190.

Figure 13:
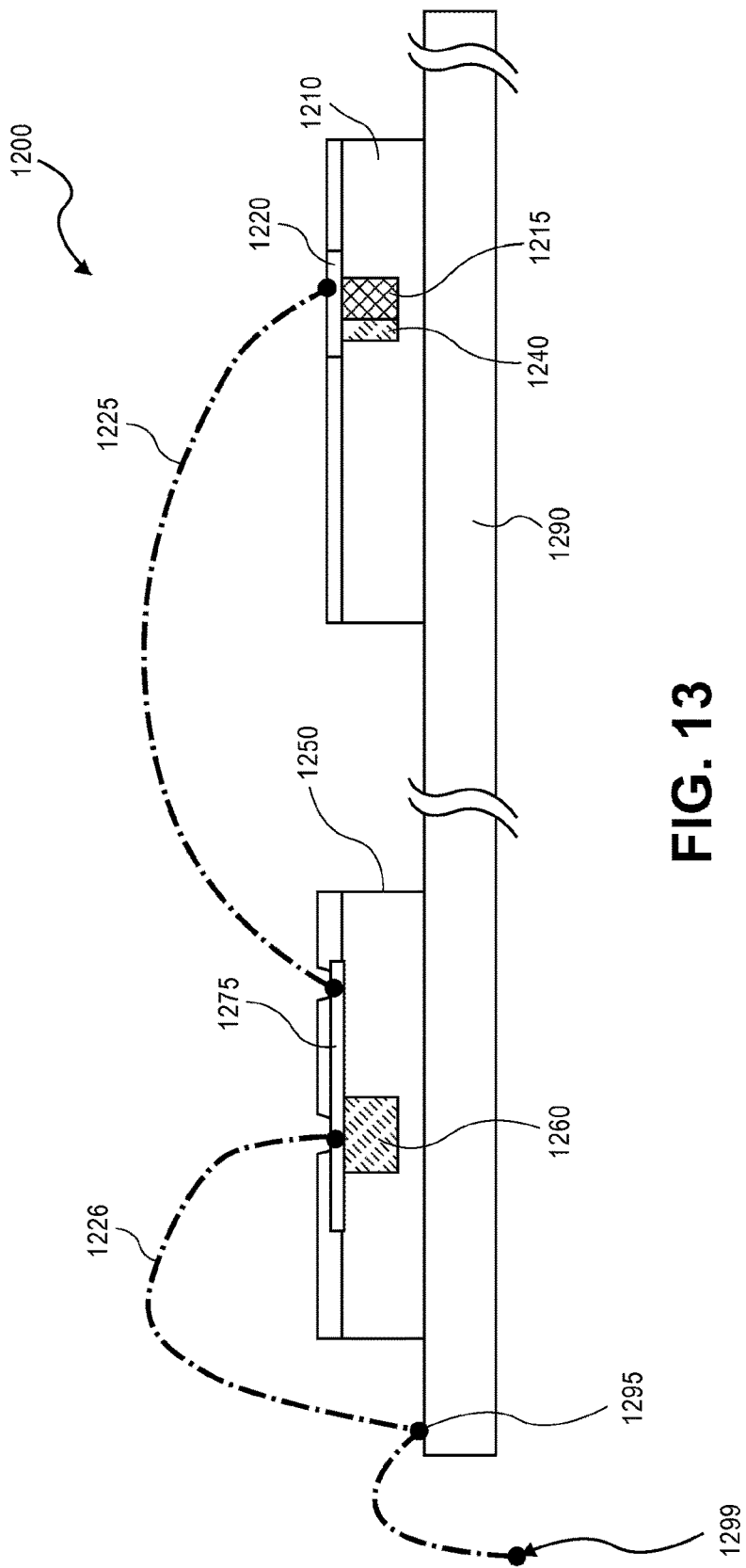
FIG. 13 shows a cross-sectional schematic side view of another embodiment of an assembly including an integrated circuit die and an interposer in a lateral orientation.

In the above embodiments, vertical or stacked oriented assemblies including one or more dies and one or more interposers are described. In another embodiment, the assembly and interposer may be laterally oriented (e.g., side-by-side oriented). FIG. 13 shows a cross-sectional side view of an embodiment of an assembly including a die and an interposer each with ESD protection where the die and interposer are in a lateral orientation. Referring to FIG. 13, assembly 1200 includes die 1210 that is, for example, an integrated circuit die including a number of I/O contact pads (contact pad 1220 shown) each connected to circuitry 1215 an ESD protection structure beneath the corresponding pad (ESD structure 1240). Die 1210 is connected to substrate 1290 that is, for example, a lead frame. Die 1210 is connected to substrate 1290 (e.g., via an adhesive) with a device side up (away from substrate 1290). Also connected to substrate 1290 is interposer 1250 also connected device side up. Interposer 1250 includes a number of contact pads (contact pad 1275) with the interposer including additional ESD protection connected to the contact pad. In this embodiment, ESD structure 1260 is shown beneath and connected to contact pad 1275 of interposer 1250. Conductive wire 1225 (a wire bond) is connected between contact pad 1220 of die 1210 and contact pad 1275 of interposer 1250 and conductive wire 1226 between contact pad 1275 and contact point 1295 of substrate 1290. In this embodiment, wire bonds provide the electrical connection between die and interposer and interposer and substrate. In another embodiment, each of the die and interposer may be connected to a substrate on a contact pad side surface and the electrical connection between the die and interposer and, optionally with substrate 1290, may be provided by such substrate. FIG. 13 shows connection point 1299 operable to electrically connect substrate 1290 to an external substrate such as a printed circuit board. In the embodiment where substrate 1290 is a lead frame, a lead frame may have its own contact pins that can be connected to a substrate such as a printed circuit board through a pin connection.

Figure 14:
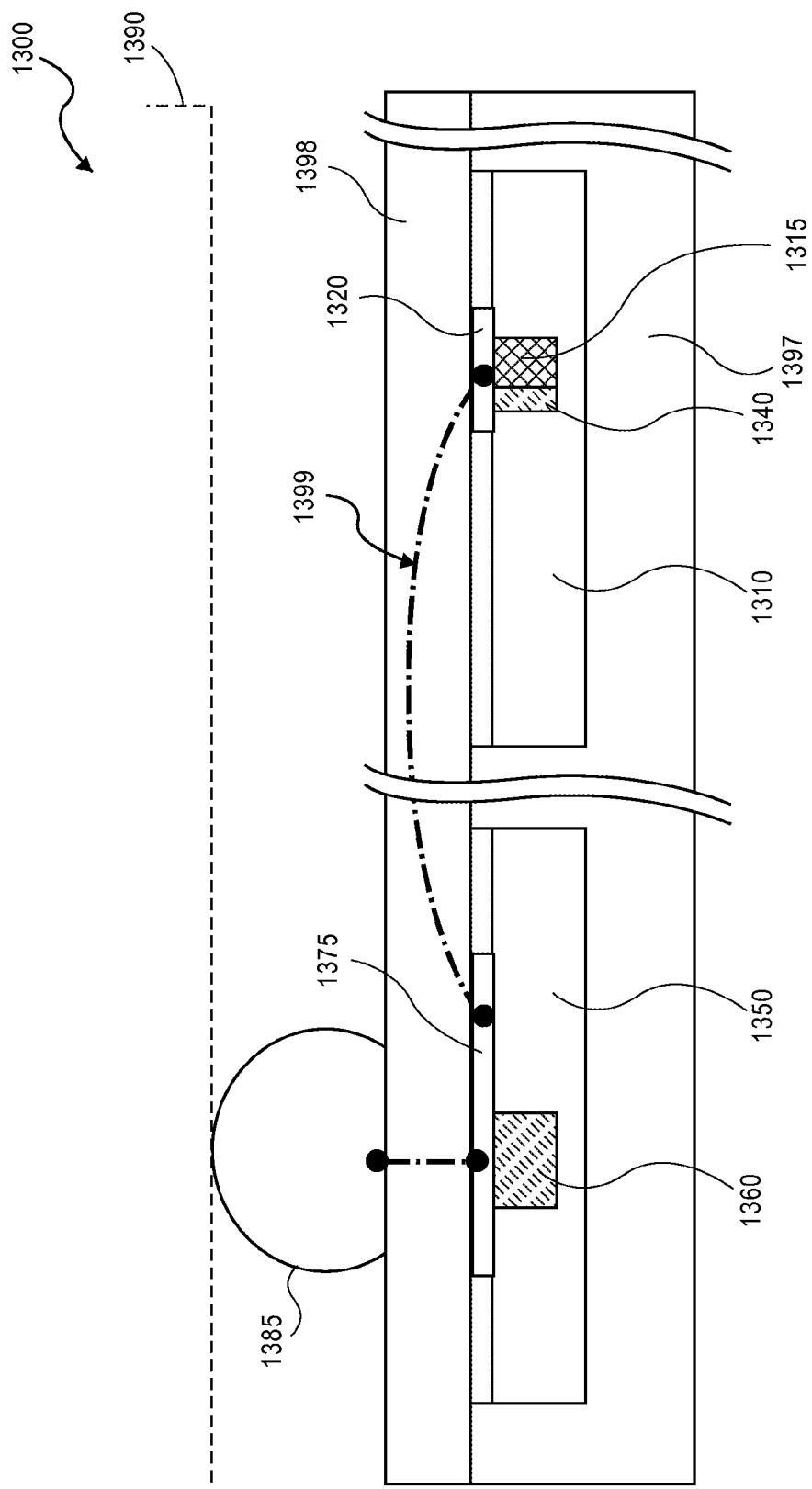
FIG. 14 shows a cross-sectional side view of another embodiment of an assembly including an integrated circuit die and an interposer each connected to a substrate in a lateral orientation.

FIG. 14 shows a cross-sectional side view of another embodiment of an assembly including an integrated circuit die and an interposer each with ESD protection to collectively protect the circuitry of the die where the die and interposer are in a lateral orientation. Referring to FIG. 14, assembly 1300 includes die 1310 that is, for example, an integrated circuit die including a number of I/O contact pads (contact pad 1320 shown) each connected to a circuit (circuit 1315) and an ESD protection structure (ESD structure 1340). Die 1310 is embedded in mold compound via a wafer level embedding process to form common substrate 1397. In this embodiment, die is embedded device side up as viewed. Also embedded device side up in mold compound 1397 is interposer 1350 in a position lateral to die 1350 (above as viewed). Die 1310 and interposer 1350 are each connected to substrate 1398 such as via solder connections to a flip chip substrate. Interposer 1350 includes a number of contact pads (contact pad 1375 shown) with the interposer including ESD protection connected to the contact pads. In this embodiment, ESD protection structure 1360 is shown beneath and connected to contact pad 1375 of interposer 1350. In one embodiment, I/O contact pads (contact pad 1320) of die 1310 may be connected to contact pad 1375 of interposer 1350 through a conductive routing through substrate 1398 or substrate 1398 may be connected to a supplemental substrate with the electrical connection established through the supplemental substrate. An opposite side surface of substrate 1398 includes contact points with solder balls 1385 to connect to the assembly to substrate 1390 (e.g., a package substrate or printed circuit board).

FIG. 14 illustrates the routing (via signal flow 1399) of a signal from solder ball (e.g., an external signal) through substrate 1398 to contact pad 1375 of interposer 1350 then to I/O contact pad 1320 at die 1310. In this manner, die 1310 (specifically I/O contacts of die 1310) are connected to the outside by way of interposer 1350.

Figure 15:
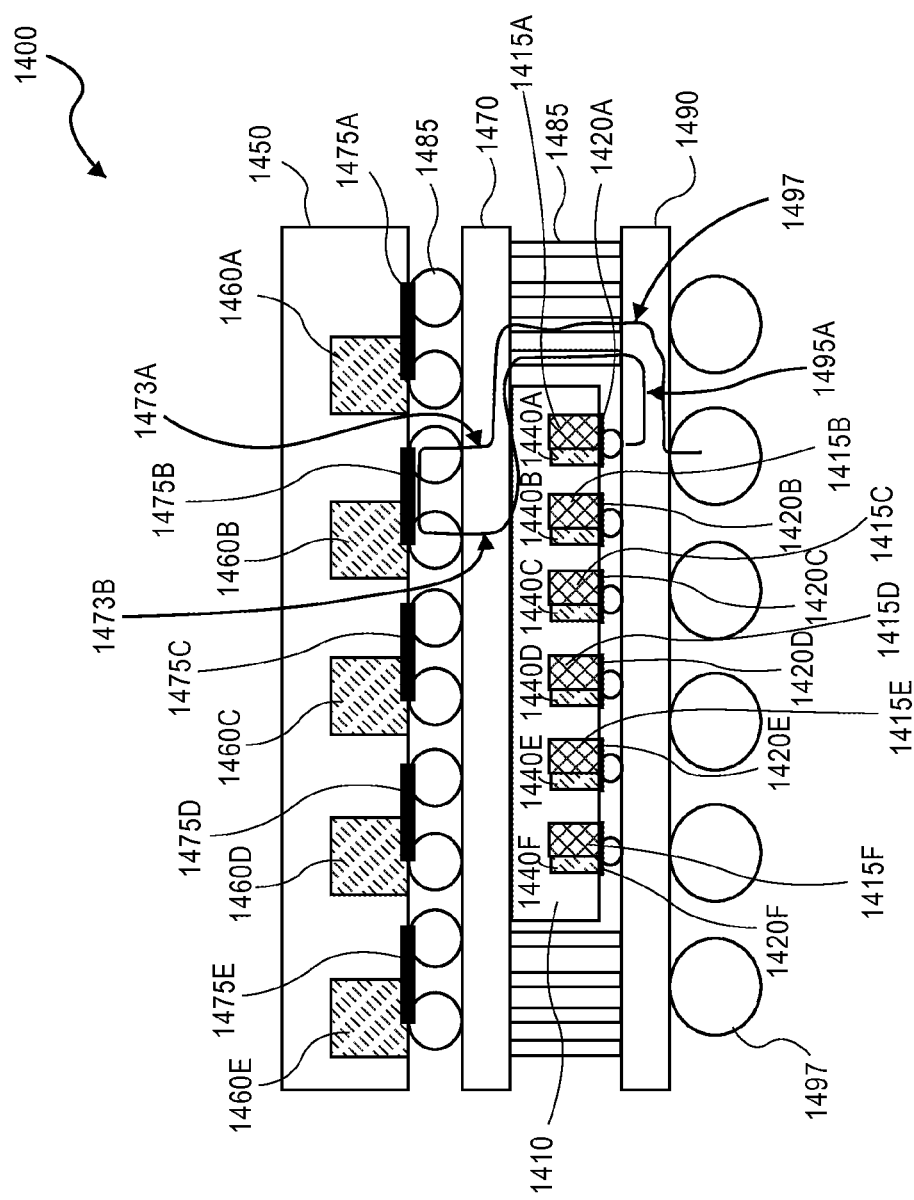
FIG. 15 shows a cross-sectional side view of another embodiment of an assembly including an integrated circuit die and an interposer in a package on package (PoP) arrangement where the die and interposer are in a vertical or stacked orientation.

FIG. 15 shows a cross-sectional side view of another embodiment of an assembly including an integrated circuit die and an interposer in a package on package (PoP) arrangement each with ESD protection to collectively protect the circuitry of the die where the die and interposer are in a vertical or stacked orientation. Assembly 1400 includes die 1410 that is, for example, an integrated circuit die including a number of I/O contact pads (contact pad 1420A, contact pad 1420B, contact pad 1420C, contact pad 1420D, contact pad 1420E and contact pad 1420F shown) each connected to circuitry (circuit 1415A, circuit 1415B, circuit 1415C, circuit 1415D, circuit 1415E and circuit 1415F shown) and an ESD protection structure beneath the corresponding pad (ESD structure 1440A, ESD structure 1440B, ESD structure 1440C, ESD structure 1440D, ESD structure 1440E and ESD structure 1440F shown). Die 1410 is electrically and physically connected to a side surface of package substrate 1490 in a flip-chip configuration so that a device side is down as viewed and circuits 1415A-F and ESD structures 1440A-F appear above corresponding contact pads 1420A-F. Die 1410 is connected to substrate 1490 through, for example, a bumping or reflow process between contacts pads of the die and the substrate, respectively. Die 1410 is connected to substrate 1490 at a central region of the substrate. Substrate 1490 includes redistribution layers or interconnects therein to which the contact pads of die 1410 are electrically connected to electrically route signals between contact pads 1420A-F and interconnects 1485 (e.g., solder bumps) disposed around a periphery of the substrate (indicated by signal routing 1495A). On a side of substrate 1490 opposite die 1410, the substrate includes a number of interconnects 1497 (e.g., solder bumps) to electrically connect substrate 1490 to an external device (e.g., a printed circuit board). FIG. 15 shows signal routing 1495B from interconnects 1497 to ones of interconnects 1485 to bring signals from a source external to assembly 1400.

FIG. 15 also shows substrate 1470 electrically and connected to a similar side surface of substrate 1490 as die 1410. In this embodiment, substrate 1470 is disposed and connected (e.g., via an adhesive) to a backside surface of die 1410. Substrate 1470 includes a number of contact pads about its periphery (an area peripheral to an area of the substrate to which die 14160 is connected). FIG. 15 shows interconnects 1485 (e.g., solder balls or through mold via (TMV)) connected to contact pads on a die side of substrate 1490 and to the contact pads on a die side of substrate 1470. Substrate 1470 includes redistribution layers or interconnects therein to bring signals through the substrate. A backside of substrate 1470 (a side opposite die 1410) includes a number of contact pads connected respectively to the signal lines in the substrate.

FIG. 15 further shows interposer 1450 electrically and physically connected to substrate 1470 on a similar side surface of substrate 1490 as die 1410. In this embodiment, interposer 1450 is disposed on a back side surface of die 1410 in a stacked orientation. Interposer 1450 includes a number of contact pads connected to substrate 1470. In one embodiment, interposer 1450 is electrically and physically connected to substrate 1470 device side down in a flip chip orientation. Interposer 1450 includes a number of contact pads (contact pad 1475A, contact pad 1475B, contact pad 1475C, contact pad 1475D and contact pad 1475E shown). Connected to the contact pads are ESD protection structures (e.g., ESD structure 1460A under contact pad 1475A, ESD structure 1460B under contact pad 1475B, ESD structure 1460C under contact pad 1475C, ESD structure 1460D under contact pad 1475D and ESD structure 1460E under contact pad 1475E). Because interposer 1450 is flipped, the ESD structures appear above the contact pads as viewed. Interposer 1450 is representatively connected to substrate 1470 through a bumping or reflow process (solder bumps 1485) between contacts pads of the interposer and the substrate, respectively.

FIG. 15 illustrates the routing of a signal from interconnect 1497 of substrate 1490 (via an outside or external source) through signal line 1495B of substrate 1490 to interconnects 1485 between substrate 1490 and substrate 1470 then through signal line 1473A of substrate 1470 to solder bump 1485 then through contact pad 1475B of interposer 1450 then back through solder bump 1485 to signal line 1473B of substrate 1470 then through the substrate to interconnect 1485 to bring the signal back to substrate 1490 then through signal line 1495A to contact pad 1420A of die 1410. In this manner, die 1410 (specifically I/O contacts of die 1410) are connected to the outside by way of interposer 1450. Assembly 1400 shown in FIG. 15 may be an initial assembly of an interposer and die to achieve a desired ESD protection robustness or a retrofit of an existing POP configured die to add additional ESD protection robustness.

Figure 16:
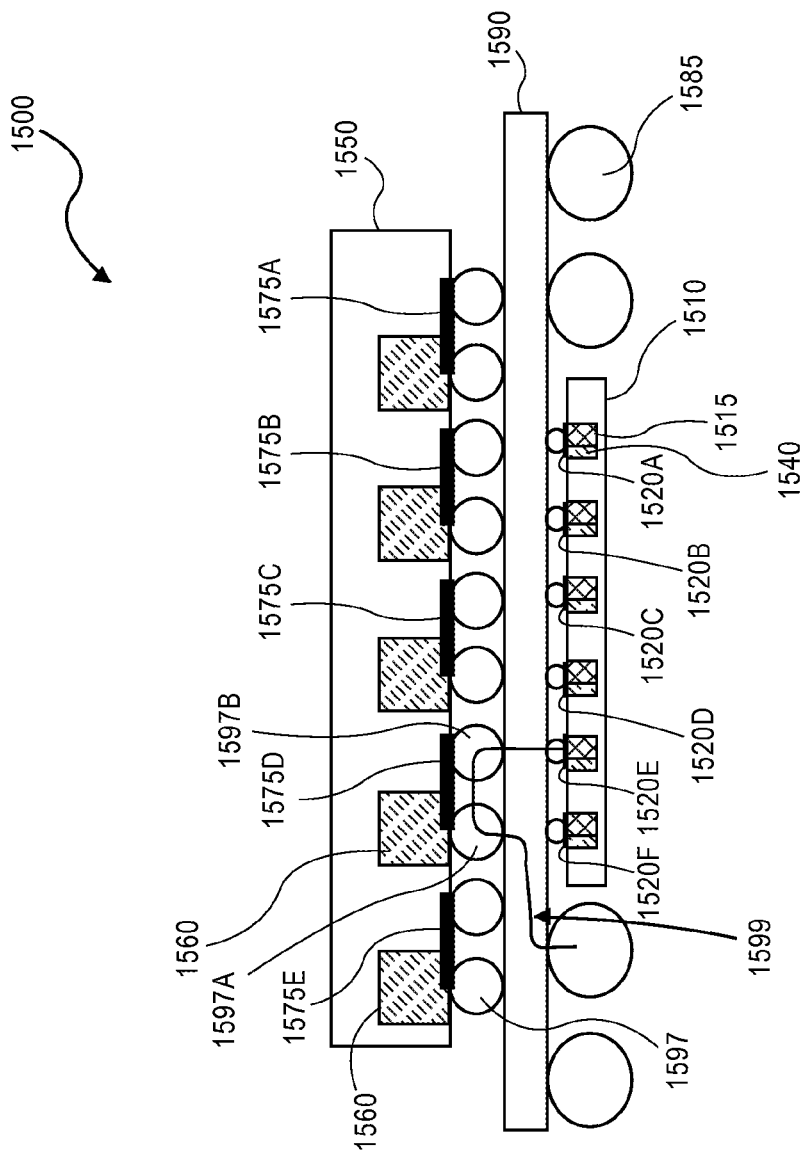
FIG. 16 shows a cross-sectional side view of another embodiment of an assembly including an integrated circuit die and an interposer connected to opposite sides of a substrate in a vertical or stacked orientation.

FIG. 16 shows a cross-sectional side view of another embodiment of an assembly including an integrated circuit die and an interposer each with ESD protection to collectively protect the circuitry of the die where the die and interposer are in a vertical or stacked orientation. Referring to FIG. 16, assembly 1500 includes die 1510 that is, for example, an integrated circuit die including a number of I/O contact pads (contact pad 1520A, contact pad 1520B, contact pad 1520C, contact pad 1520D, contact pad 1520E and contact pad 1520F shown) each electrically connected to circuit 1515 and an ESD protection structure 1540. Die 1510 is electrically and physically connected to a side surface of substrate 1590 in an opossum or hanging die configuration (an underside surface as viewed) through, for example, a bumping or reflow process between contacts points of the die and the substrate, respectively. Die 1510 is connected to substrate device side down though contact pads 1520 on the device side appear upward in this hanging configuration as viewed. Die 1510 is connected to substrate 1590 at a central region of the substrate. FIG. 16 also shows interconnects 1585 (e.g., solder bumps) disposed around a periphery of the substrate operable to connect substrate 1590 to an external device (e.g., a printed circuit board).

Substrate 1590 of assembly 1500 includes contact pads on a die side of the substrate and contact pads on an opposite side of the substrate. Signal lines are distributed or routed through the substrate between contact pads on either side.

FIG. 16 further shows interposer 1550 electrically and physically connected to an opposite side surface of substrate 1590. Interposer 1550 includes a number of contact pads connected to substrate 1590 device side down in a flip chip orientation (contact pad 1575A, contact pad 1575B, contact pad 1575C, contact pad 1575D and contact pad 1575E shown). Electrically connected to and disposed under each of the contact pads are ESD protection structures 1560. Interposer 1550 is representatively connected to substrate 1590 through a bumping or reflow process between contacts points of the interposer and the substrate, respectively. FIG. 16 shows two separate solder connections between an interposer contact pad and contacts pads on substrate 1590.

FIG. 16 illustrates the routing (via signal flow 1599) of a signal from solder balls 1585 connected to substrate 1590 through a first solder connection 1597A to contact pad 1575D of interposer 1550 then through contact pad 1575D to a second solder connection 1597B associated with the contact pad to contact pad 1520E of die 1510. In this manner, die 1510 (specifically I/O contacts of die 1510) are connected to the outside by way of interposer 1550.

Figure 17:
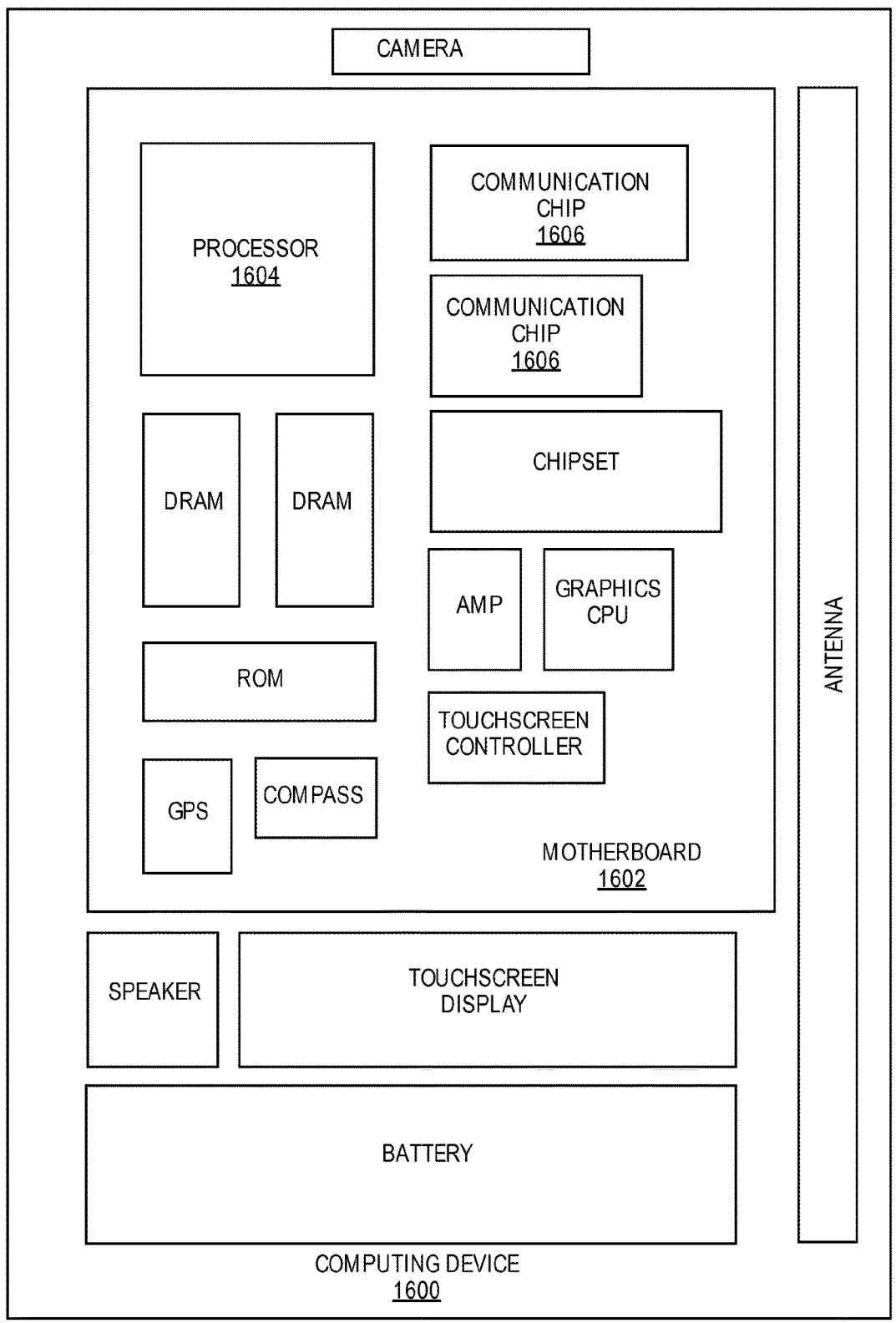
FIG. 17 illustrates an embodiment of a computing device.

FIG. 17 illustrates computing device 1600 in accordance with one implementation. Computing device 1600 houses printed circuit board 1602. Board 1602 may include a number of components, including but not limited to processor 1604 and at least one communication chip 1606. Processor 1604 is physically and electrically coupled to board 1602. In some implementations at least one communication chip 1606 is also physically and electrically coupled to board 1602. In further implementations, communication chip 1606 is part of processor 1604.

Depending on its applications, computing device 1600 may include other components that may or may not be physically and electrically coupled to board 1602. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

Communication chip 1606 enables wireless communications for the transfer of data to and from computing device 1600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chip 1606 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. Computing device 1600 may include a plurality of communication chips 1606. For instance, first communication chip 1606 may be dedicated to shorter range wireless communications such as Wi-Fi and Bluetooth and second communication chip 1606 may be dedicated to longer range wireless communications such as GPS, EDGE, GPRS, CDMA, WiMAX, LTE, Ev-DO, and others.

Processor 1604 of computing device 1600 includes an integrated circuit die packaged within processor 1604. In some implementations, the integrated circuit die of the processor includes one or more devices, such as transistors or metal interconnects, and includes I/O contacts. Processor 1604 may be packaged with an interposer in an assembly such as described herein. The term "processor" may refer to any device or portion of a device that processes electronic data from registers and/or memory to transform that electronic data into other electronic data that may be stored in registers and/or memory.

Communication chip 1606 also includes an integrated circuit die packaged within communication chip 1606. In accordance with another implementation, the integrated circuit die of the communication chip includes one or more devices, such as transistors or metal interconnects, and includes I/O contacts. Communication chip 1606 may be packaged with an interposer in an assembly such as described herein.

In further implementations, another component housed within computing device 1600 may contain an integrated circuit die that includes one or more devices, such as transistors or metal interconnects, and includes I/O contacts. The integrated circuit die may be packaged with an interposer in an assembly such as described herein.

In various implementations, computing device 1600 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, computing device 1600 may be any other electronic device that processes data.

EXAMPLES

Example 1 is an apparatus including an electrostatic discharge circuit including a first circuit portion coupled beneath a die contact pad of an integrated circuit die and a second circuit portion in an interposer separate from the integrated circuit die, the interposer including a first contact point coupled to the contact pad of the integrated circuit die and a second contact point operable for connection to an external source.

In Example 2, the first circuit portion in the apparatus of Example 1 includes an ESD robustness that is different than an ESD protection robustness of the second circuit portion.

In Example 3, the first circuit portion in the apparatus of Example 2 includes a smaller maximum discharge current than a maximum discharge current of the second circuit portion and a failure threshold and failure threshold voltage of the second circuit portion is less than a failure threshold voltage of the first circuit portion.

In Example 4, the interposer in the apparatus of Examples 1-3 includes an interposer contact pad operable to connect an assembly of the die and the interposer to a substrate and the second circuit portion is coupled to the interposer contact pad and the die contact pad.

In Example 5, the first circuit portion and the second circuit portion in the apparatus of Example 4 are coupled to a substrate and arranged vertically with respect to the other.

In Example 6, the first circuit portion and the second circuit portion in the apparatus of Example 4 are coupled to a substrate and arranged laterally with respect to the other.

In Example 7, the apparatus of Example 6 further includes a redistribution layer including a conductive material coupled to the die contact and the interposer contact.

In Example 8, the redistribution layer in the apparatus of Example 7 includes one of a redistribution layer of the die and a redistribution layer of the interposer.

In Example 9, the apparatus of Example 7 further includes a substrate, wherein each of the die and the interposer are coupled to the substrate and the redistribution layer is disposed in the substrate.

In Example 10, the first circuit portion in the apparatus of Example 6 is coupled to the second circuit portion by a wire bond connection or routing through a substrate.

In Example 11, the apparatus of Example 1 further includes a substrate wherein the interposer is embedded in the substrate.

Example 12 is an apparatus including a substrate including a contact operable to electrically couple the substrate to an external device; an integrated circuit die including a first electrostatic discharge structure beneath a contact pad of the die; an interposer including an interposer contact and a second electrostatic discharge structure, wherein the die and the interposer are coupled to the substrate and a signal between the substrate contact and the contact pad of the die is operable to be routed through the interposer.

In Example 13, the first electrostatic discharge structure in the apparatus of Example 12 includes an ESD protection robustness that is different than an ESD protection robustness of the second electrostatic discharge structure.

In Example 14, the first electrostatic discharge structure in the apparatus of Example 13 includes a smaller maximum discharge current than a maximum discharge current of the second electrostatic discharge structure and a failure threshold voltage of the second electrostatic discharge structure is less than a failure threshold voltage of the first electrostatic discharge structure.

In Example 15, the die and the interposer in the apparatus of Examples 12-14 are arranged vertically with respect to the other.

In Example 16, the die and the interposer in the apparatus of Examples 12-14 are arranged laterally with respect to the other.

In Example 17, one of the interposer and the substrate in the apparatus of Examples 12-16 include a redistribution layer comprising a conductive material coupled to the die contact.

In Example 18, the interposer in the apparatus of Examples 12-16 is embedded in the substrate.

Example 19 is a method including forming an integrated circuit die including a first electrostatic discharge structure beneath a contact pad of the die; and coupling the die to an interposer including an interposer contact and a second electrostatic discharge structure, wherein a signal at the contact pad of the die is operable to be routed through the interposer.

In Example 20, the first electrostatic discharge structure in the apparatus of Example 19 includes a smaller maximum discharge current than a maximum discharge current of the second electrostatic discharge structure and a failure threshold voltage of the second electrostatic discharge structure is less than a failure threshold voltage of the first electrostatic discharge structure.

In Example 21, the ESD protection robustness of the first electrostatic discharge structure in the method of Example 19 is different than the ESD protection robustness of the second electrostatic discharge structure.

In Example 22, coupling the die to the interposer in the method of Example 19 includes coupling the die and interposer in a stacked orientation.

In Example 23, coupling the die to the interposer in the method of Example 19 includes coupling the die and interposer laterally with respect to the other.

Example 24 is an assembly made by any of the methods of Examples 9-23.

The above description of illustrated implementations, including what is described in the Abstract, is not intended to be exhaustive or to limit the invention to the precise forms disclosed. While specific implementations of, and examples for, the invention are described herein for illustrative purposes, various equivalent modifications are possible within the scope, as those skilled in the relevant art will recognize.

These modifications may be made to the invention in light of the above detailed description. The terms used in the following claims should not be construed to limit the invention to the specific implementations disclosed in the specification and the claims. Rather, the scope is to be determined entirely by the following claims, which are to be construed in accordance with established doctrines of claim interpretation.

The invention claimed is:

1. An apparatus comprising:
an electrostatic discharge circuit comprising a first circuit portion coupled beneath a die contact pad of an integrated circuit die and a second circuit portion in an interposer separate from the integrated circuit die, the interposer comprising a first contact point coupled to the contact pad of the integrated circuit die and a second contact point operable for connection to an external source, wherein the first circuit portion of the electrostatic discharge circuit comprises a first diode, wherein the second circuit portion of the electrostatic discharge circuit comprises a second diode, and wherein the first circuit portion of the electrostatic discharge circuit is directly electrically connected to the second circuit portion of the electrostatic discharge circuit.

2. The apparatus of claim 1, wherein the first circuit portion comprises an ESD robustness that is different than an ESD protection robustness of the second circuit portion.

3. The apparatus of claim 2, wherein the first circuit portion comprises a smaller maximum discharge current than a maximum discharge current of the second circuit portion and a trigger voltage of the second circuit portion is less than a trigger voltage of the first circuit portion.

4. The apparatus of claim 1, wherein the interposer comprises an interposer contact pad operable to connect an assembly of the die and the interposer to a substrate and the second circuit portion is coupled to the interposer contact pad and the die contact pad.

5. The apparatus of claim 4, wherein the first circuit portion and the second circuit portion are coupled to the substrate and arranged vertically with respect to the other.

6. The apparatus of claim 4, wherein the first circuit portion and the second circuit portion are coupled to the substrate and arranged laterally with respect to the other.

7. The apparatus of claim 6, wherein the first circuit portion is coupled to the second circuit portion by a wire bond connection or routing through the substrate.

8. The apparatus of claim 1, further comprising a redistribution layer comprising a conductive material coupled to the die contact and the interposer contact.

9. The apparatus of claim 8, wherein the redistribution layer comprises one of a redistribution layer of the die and a redistribution layer of the interposer.

10. The apparatus of claim 8, further comprising a substrate, wherein each of the die and the interposer are coupled to the substrate and the redistribution layer is disposed in the substrate.

11. The apparatus of claim 1, further comprising a substrate wherein the interposer is embedded in the substrate.

12. An apparatus comprising:
a substrate comprising a contact operable to electrically couple the substrate to an external device;
an integrated circuit die comprising a first electrostatic discharge structure beneath a contact pad of the die, wherein the first electrostatic discharge structure comprises a first diode;
an interposer comprising an interposer contact and a second electrostatic discharge structure, wherein the die and the interposer are coupled to the substrate and a signal between the substrate contact and the contact pad of the die is operable to be routed through the interposer, wherein the second electrostatic discharge structure comprises a second diode, and wherein the first electrostatic discharge structure is directly electrically connected to the second electrostatic discharge structure.

13. The apparatus of claim 12, wherein the first electrostatic discharge structure comprises an ESD protection robustness that is different than an ESD protection robustness of the second electrostatic discharge structure.

14. The apparatus of claim 13, wherein the first electrostatic discharge structure comprises a smaller maximum discharge current than a maximum discharge current of the second electrostatic discharge structure and a trigger voltage of the second electrostatic discharge structure is less than a trigger voltage of the first electrostatic discharge structure.

15. The apparatus of claim 12, wherein the die and the interposer are arranged vertically with respect to the other.

16. The apparatus of claim 12, wherein the die and the interposer are arranged laterally with respect to the other.

17. The apparatus of claim 12, wherein one of the interposer and the substrate comprise a redistribution layer comprising a conductive material coupled to the die contact.

18. The apparatus of claim 12, wherein the interposer is embedded in the substrate.

19. A method comprising:
forming an integrated circuit die comprising a first electrostatic discharge structure beneath a contact pad of the die, wherein the first electrostatic discharge structure comprises a first diode; and
coupling the die to an interposer comprising an interposer contact and a second electrostatic discharge structure, wherein the second electrostatic discharge structure comprises a second diode, wherein the first electrostatic discharge structure is directly electrically connected to the second electrostatic discharge structure, and wherein a signal at the contact pad of the die is operable to be routed through the interposer.

20. The method of claim 19, wherein the first electrostatic discharge structure comprises a smaller maximum discharge current than a maximum discharge current of the second electrostatic discharge structure and a trigger voltage of the second electrostatic discharge structure is less than a trigger voltage of the first electrostatic discharge structure.

21. The method of claim 19, wherein the ESD protection robustness of the first electrostatic discharge structure is different than the ESD protection robustness of the second electrostatic discharge structure.

22. The method of claim 19, wherein coupling the die to the interposer comprises coupling the die and interposer in a stacked orientation.

23. The method of claim 19, wherein coupling the die to the interposer comprises coupling the die and interposer laterally with respect to the other.

* * * * *